United States Patent
Teklemariam et al.

(10) Patent No.: US 8,203,341 B2
(45) Date of Patent: Jun. 19, 2012

(54) CYLINDRICAL BI-PLANAR GRADIENT COIL FOR MRI

(75) Inventors: Grum Teklemariam, North Andover, MA (US); Jianyu Lian, Westford, MA (US)

(73) Assignee: XBO Medical Systems Co., Ltd., Baotou, Inner Mongolia (CN)

( * ) Notice: Subject to any disclaimer, the term of this patent is extended or adjusted under 35 U.S.C. 154(b) by 877 days.

(21) Appl. No.: 10/944,080

(22) Filed: Sep. 17, 2004

(65) Prior Publication Data

US 2005/0146330 A1      Jul. 7, 2005

Related U.S. Application Data

(60) Provisional application No. 60/504,371, filed on Sep. 19, 2003.

(51) Int. Cl.
*G01V 3/00*      (2006.01)

(52) U.S. Cl. .................................................. 324/318
(58) Field of Classification Search ........... 324/300–322
See application file for complete search history.

(56) References Cited

U.S. PATENT DOCUMENTS

| | | | | | |
|---|---|---|---|---|---|
| 5,481,191 | A | * | 1/1996 | Rzedzian | 324/318 |
| 5,572,131 | A | * | 11/1996 | Rzedzian | 324/318 |
| 6,011,394 | A | * | 1/2000 | Petropoulos et al. | 324/318 |
| 6,311,389 | B1 | * | 11/2001 | Uosaki et al. | 29/605 |
| 2005/0035764 | A1 | * | 2/2005 | Mantone et al. | 324/318 |

* cited by examiner

*Primary Examiner* — Dixomara Vargas
(74) *Attorney, Agent, or Firm* — Bay State IP, LLC; Adam J. Bruno

(57) ABSTRACT

Cylindrical bi-planar gradient coil assemblies for use in open magnetic resonance imaging, wherein each of the coil assemblies contains in sequential order (i) a circular primary coil set placed flat above a cylindrical planar substrate, (ii) cooling means, (iii) $0^{th}$ and $2^{nd}$ order shims, (iv) shield layers, and (v) $1^{st}$ order shims. In use the gradient coil assemblies are disposed symmetrically to each other about a plane of symmetry parallel to each.

8 Claims, 9 Drawing Sheets

US 8,203,341 B2

CYLINDRICAL BI-PLANAR GRADIENT COIL FOR MRI

PRIORITY CLAIM

This application claims priority from U.S. Provisional Application 60/504,371, filed Sep. 19, 2003.

BACKGROUND OF THE INVENTION

The present invention is directed to a gradient coil design and manufacturing process for making self-shielded gradient coil sets for use in cylindrical bi-planar open magnetic resonance imaging (MRI).

Progress in MRI scanner design has taken two directions. The first has been towards higher field traditional magnet systems while the second has been towards low field open magnet systems. By "high field" magnet systems is meant those wherein the field strength is greater than 10,000 gauss and which require superconducting wire technology to generate the magnetic fields. "Low field" magnet systems are those in which the field strength is about 5,000 gauss and below and use permanent magnets or electrical coils. In general, the cost of the magnetic field producing material is a very strong function of the imaging volume. This is more so the case for open magnet structures than for cylindrical magnets. Therefore, image space management is crucial. In open MRI systems, the gradient and rf coils, which have to be placed within the imaging volume, take up significant space. In particular, an efficient and compact structure for stacking the gradient coil layers, which typically can take up to 20-30% of the image space in the vertical direction, is a very important goal. Moreover, the planar extent has to be limited as much as possible because the gradient coil must be contained within the magnet poles. The volume, size and weight of the magnets scale quadratically with the radius of the magnet. Thus this variation is the dominant factor that controls the cost of the magnet. Therefore, limiting the planar extent of the magnet and magnet poles should be a primary goal of any MRI system design.

In designing open, MRI systems the traditional approach has entailed using unshielded gradient coils and then trying to design a magnet system that would minimize the natural interactions between the gradient fields and magnets. Although the approach has had some success, it restricts the scanner from performing many MRI applications, particularly those requiring the use of bipolar current waveforms to drive the gradient coils due to eddy currents and residual gradient fields from conductive surfaces and magnet materials. In contrast, the present invention in which shielded gradient coils are used is based upon a systems approach that seeks to avoid all interactions between the magnet and the gradient and rf coils, thereby enabling all MRI applications to be possible.

It has also been discovered that the performance of open MRI systems can be further improved (and the cost lowered) by including active shims in the shielded gradient coils. The system can achieve up to two or more orders of magnitude improvement in magnetic field homogeneity by including $0^{th}$, $1^{st}$, $2^{nd}$ and higher order active shims.

Furthermore, permanent magnets are heated differentially from unshielded gradient coils causing inhomogeneities and thermal drifts in magnet materials. It has been determined that adding cooling means in the gradient space can alleviate this significantly. Heretofore the cooling mechanisms had taken up too much space, so that the trade off had not been considered beneficial.

The present invention utilizes a gradient coil design that includes shims and cooling mechanisms located inside the gradient coil to achieve these improvements and allow a more compact open magnet design without sacrificing field homogeneity and performance.

Aside from physical constraints there are also imaging requirements on a gradient coil's performance that are met with the shielded gradient coils which allow the full complement of MRI applications. The use of shielded gradient coils that include active shims in an open MRI system has translated into a significant performance enhancement that combines stable homogeneity derived from self-shielding and additional active shim sets.

Unexpectedly, the present system has also been found to suppress the acoustic noise generated by the gradient coils. This is due to the inherent greater physical size of shielded gradient coils that combined with the opposing gradient fields of a shielded configuration helps to stiffen the gradient assembly and generate reduced torque effects.

The present invention is based upon a design methodology and a manufacturing process to make an open self-shielded gradient coil with the following features and benefits:

(1) ultra-fast switching;
(2) full $0^{th}$, $1^{st}$, and $2^{nd}$ order active shims and the capacity to provide even $3^{rd}$, $4^{th}$, $5^{th}$ or higher order active shims if needed;
(3) compact physical thickness and planar extent to maximize subject access space and minimize magnet pole face space;
(4) air or water cooling; and
(5) construction and mounting method to suppress acoustic noise generation.

The method and manufacturing process described enhance open magnet MRI performance substantially while providing significant cost benefits due to the substantial reduction in the open magnet size.

BRIEF DESCRIPTION OF THE DRAWINGS

FIG. 1b is a top view of the MRI machine of FIG. 1a.

SUMMARY OF THE INVENTION

Figure 1A:
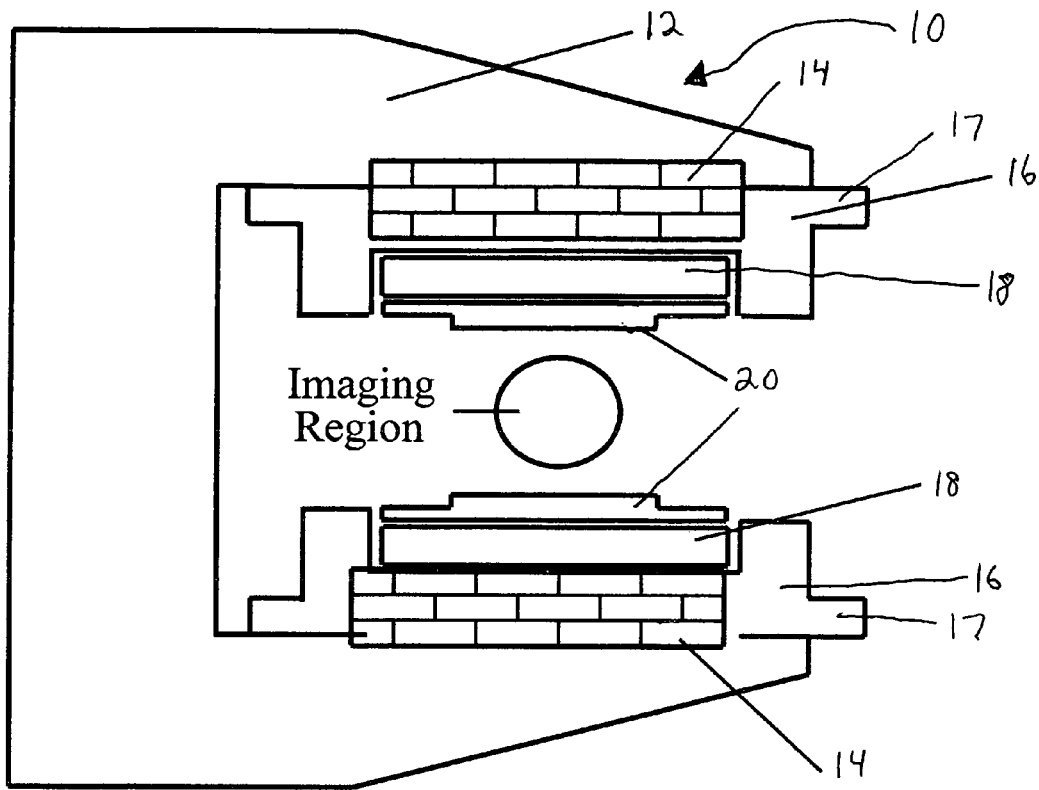
FIG. 1a is a cross-sectional view of a magnetic resonance imaging (MRI) machine in accordance with the present invention.

The present invention is directed to a gradient coil assembly for use in magnetic resonance imaging, said coil assembly including (i) a circular primary coil set placed flat atop a first and second cylindrical planar substrate disposed symmetrically to each other about a plane of symmetry parallel to each. The primary coil set is driven by a pulsed current signal for generating a spatially varying magnetic field in the central plane.

The assembly further includes a circular shield coil set for the primary coil set placed coplanar and atop the outer surfaces of the primary coil set about the first and second cylindrical planar substrates. The shield coil set is driven by a pulsed current signal that is substantially 180° out-of-phase with respect to the pulsed current signal in the primary coil set for generating a spatially varying magnetic field in a direction substantially opposite to the first spatially varying magnetic field and substantially canceling the magnetic field in a region cylindrically outside of the outer surfaces of the shield layers.

Preferably the assembly further includes a cooling mechanism placed coplanar and atop the primary coil set between the primary coil and shield coil sets.

Also preferably the assembly includes a set of circular correction coils comprising the 0th, 1st, 2nd, and higher order Legendre polynomial harmonics totaling about nine or more mutually orthogonal coil sets for actively shimming the main magnetic field, placed coplanar to the primary and shield coil sets in the cylindrical planar substrates symmetrically disposed about the planar surface. The 1st order correction coil sets are placed atop the shield coil set and the 0th, 2nd and higher order correction coils are placed between the primary and shield coil sets and atop the cooling mechanism. Generally the primary patterns are denser generating the most heat so placing the cooling mechanism directly above the primaries is desirable.

The primary coil sets, the shield coil sets, the cooling mechanism and the 0th, 1st and 2nd correction coils are supported within a pair of cylindrical planar formers.

The primary coil set generally contain three coils each generating one of three mutually orthogonal linearly-varying magnetic fields and the shield coil set generally contains three coils generating a linearly-varying magnetic field to substantially oppose the complimentary primary coil field above the shield layer surface. The 0th, 1st and 2nd order correction coils are designed to have a planar circular footprint.

The cylindrical bi-planar gradient coil assembly contains in sequential order (i) a circular primary coil set placed flat above a first and second cylindrical planar substrate disposed symmetrically to each other about a plane of symmetry parallel to each, (ii) cooling means, (iii) $0^{th}$ and $2^{nd}$ order shims, (iv) shield layers, and (v) $1^{st}$ order shims.

The primary coil set includes an X-primary, followed by a first insulating layer, then a Y-primary, a second insulating layer, and a Z-primary.

DETAILED DESCRIPTION OF THE INVENTION

Figure 1B:
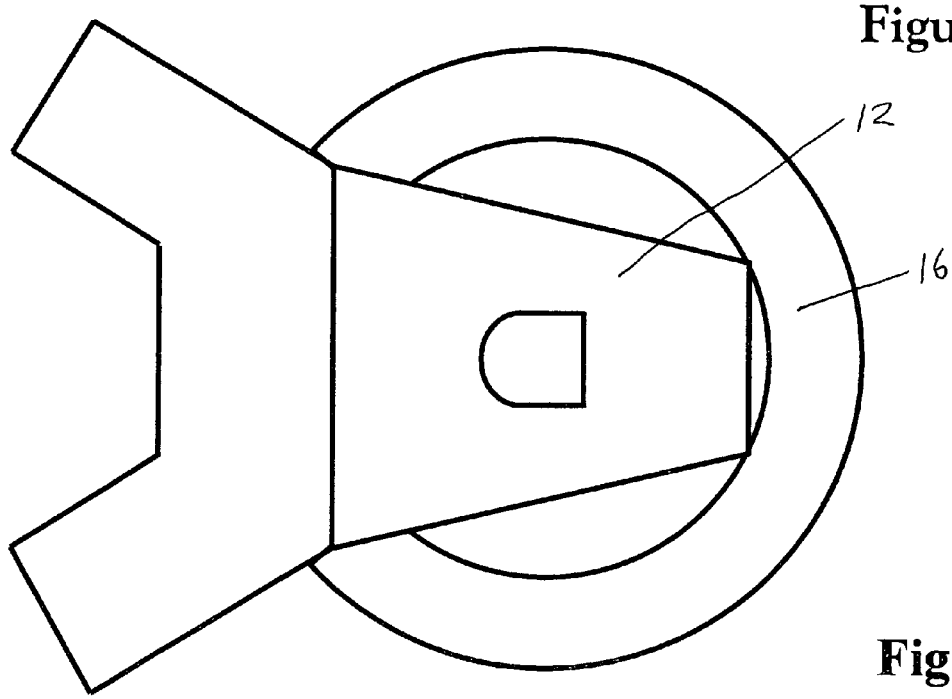
Figure 2:
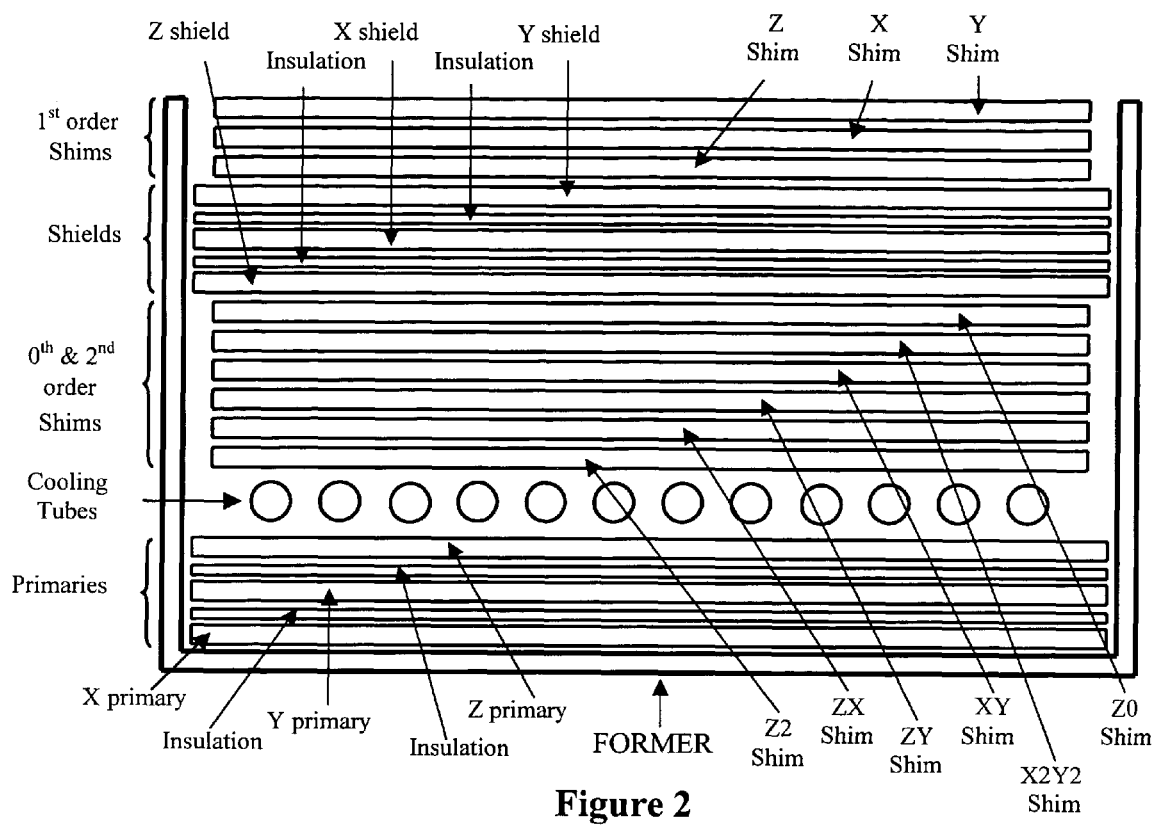
FIG. 2 is a cross-sectional view of a gradient coil set showing the stacking of the elements of the gradient coil set.

The magnetic resonance imaging apparatus 10 is constructed as shown in FIGS. 1a and 1b. It has a magnetic yoke 12 magnetically connected to a magnetic circuit arrangement comprising a pair of permanent magnet blocks 14 each attached to the surface of a pole 16, which has annular protrusions 17 for field shaping. The magnet blocks 14 also have space for magnetic field gradient coil assemblies 18 and rf coil assemblies 20, disposed opposite each other so as to define a gap which is used as the imaging region. The permanent magnet blocks 14 are magnetically connected by the yoke 12 to generate a magnetic field in the gap. The gap has a sufficient opening to insert a subject therein for the purposes of obtaining tomographic images. The apparatus is specifically designed for magnetic resonance imaging (MRI) purposes although other applications that require the use of a static uniform magnetic field may also be performed with the system.

The insertion gap used as an imaging region, is required to have a magnetic strength greater than 0.1 T (1,000 gauss) and a uniformity less than 100 ppm (parts per million) throughout to obtain images of sufficient clarity. The imaging region is large enough to image a human being and has a diameter spherical volume (DSV) of about 10 to about 50 cm, preferably about 40 cm. The DSV is critical to determining the dimensions of the gap and the diameter of the pole pieces of a suitable magnet.

The choice of design methodology and the design innovations for the planar open gradient coil is based on imaging requirements and physical constraints. The imaging requirements demand that there be minimal eddy current and residual magnetization production, ultra-fast switching capability and high gradient strengths to yield very high slew rates, and highly linear gradient fields. Physically, what is required is limiting the gradient coil stacking thickness and planar extent. These demands are met by using the target field method specifically solved in polar coordinates to allow the use of a radial envelope function, which is the key to limiting the radial extent of the gradient coil. Moreover, this approach allows a theoretically correct solution for the shield coil layer similarly limited in radial extent and easily extended to shim coil designs of any order.

In the open bi-planar cylindrical systems of the present invention, axial gradients are made from a pair of identical coaxial coils disposed symmetrically to each other about a central plane and driven with opposing currents. A highly linear, very high efficiency and low inductance axial gradient is produced by using a Maxwell pair configuration. This condition is met when the coils are separated by an axial length equal to 2a and their radii are each given by 2a $/\sqrt{3}$, where "a" is one-half the distance between the upper and lower coils along the axial direction. Using this configuration for the primary coil the target field method can be used to design a shield. The resulting axial gradient is so drastically changed that the performance is very poor. To produce a similar performance with the added shields requires finding new radial distributions for the primaries, which can be done by allowing the current densities to have more than one radial density distribution. Adding these degrees of freedom in the target field specification and using a Nelder-Mead simplex optimization algorithm, one can find an optimal design for the radial current density distributions that yields very high efficiency, linearity and low inductance axial shielded gradients.

To save vertical space the shields are made as close as possible to the primaries, but doing so diminishes the performance of the overall gradient. This is overcome by making the current densities, especially in the primaries, very dense at two or more regions. This can be seen in FIG. 3a, a coil pattern for axial primary coils. The dense regions are obtained from the aforementioned optimization. The code generates the optimal position, i.e. the position that yields the lowest inductance, highest strength gradient and linearity. Constructing such coils has been found to be a manufacturing challenge. To avoid high resistances and generating heat, high-pressure water-jet cutting of a copper plate (or other suitable machining technique) has been found to be particularly suitable. Alternatively but less desirably, one could use wires. The construction method is described further below.

Figure 3A:
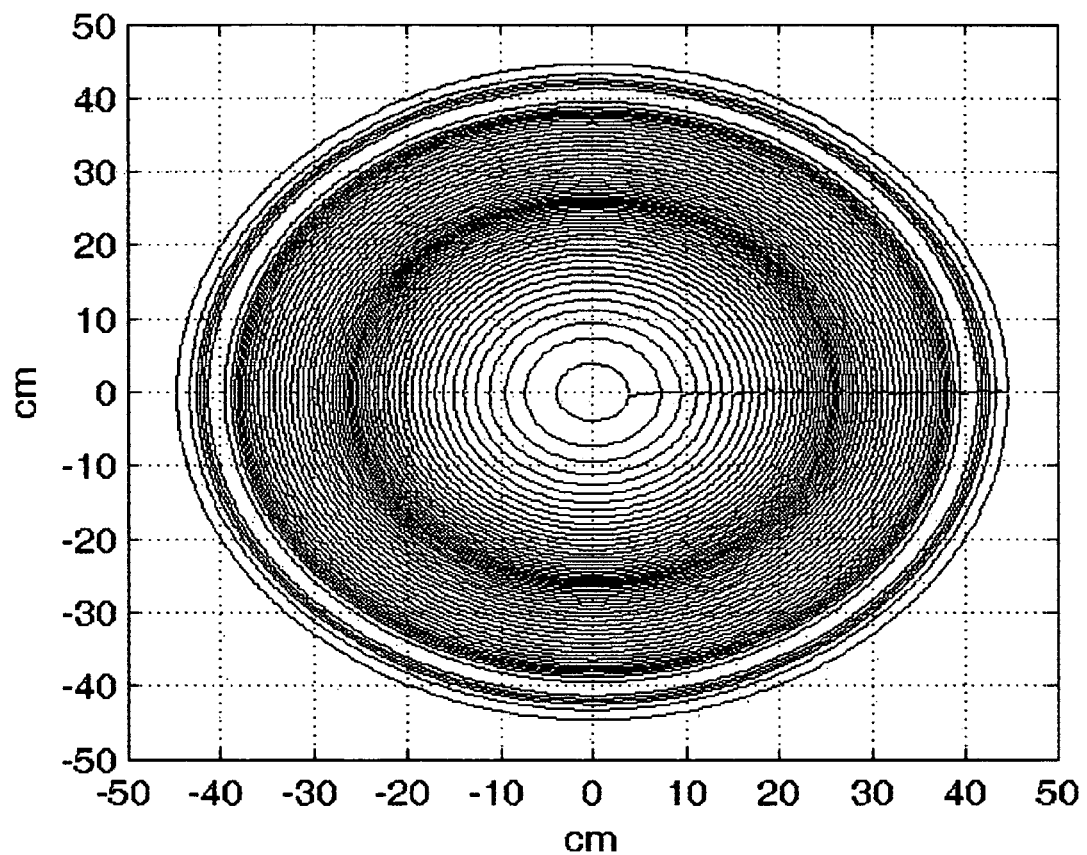
FIG. 3a shows a Z primary axial coil pattern with a circular footprint.
Figure 3B:
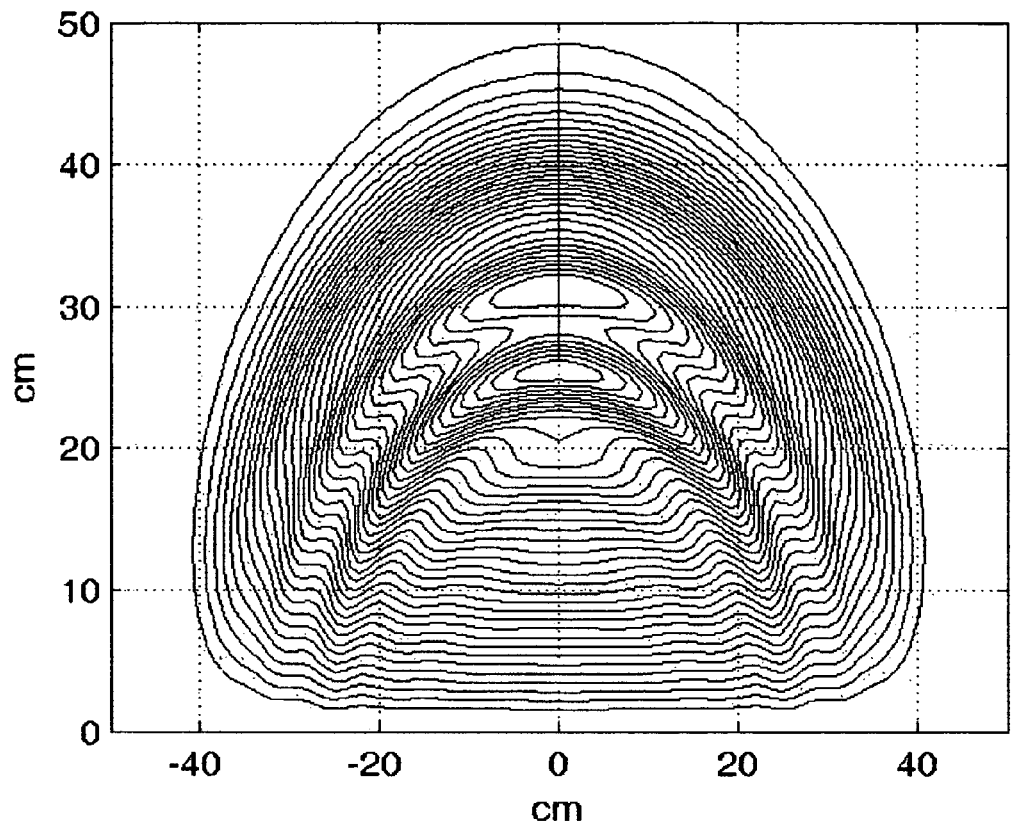
FIG. 3b shows one half of an X or Y primary transverse coil pattern with a circular footprint.
Figure 3C:
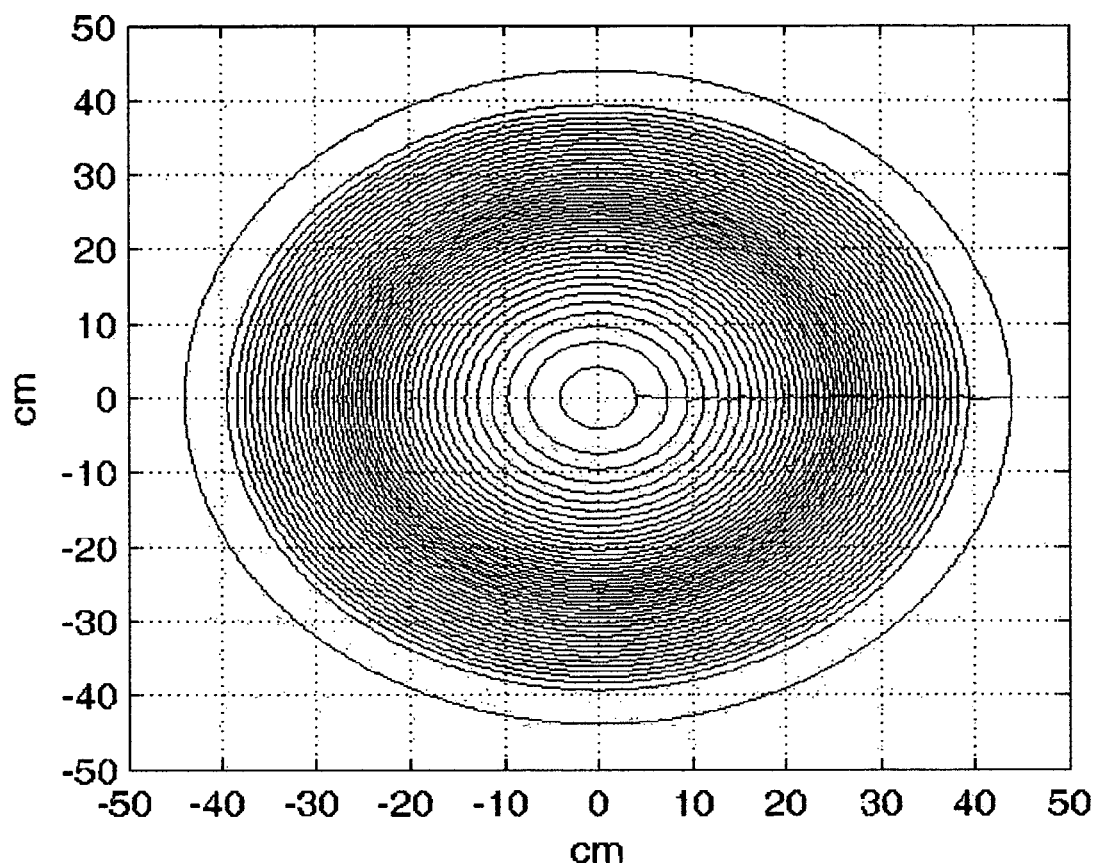
FIG. 3c shows a Z shield axial coil pattern with a circular footprint.
Figure 3D:
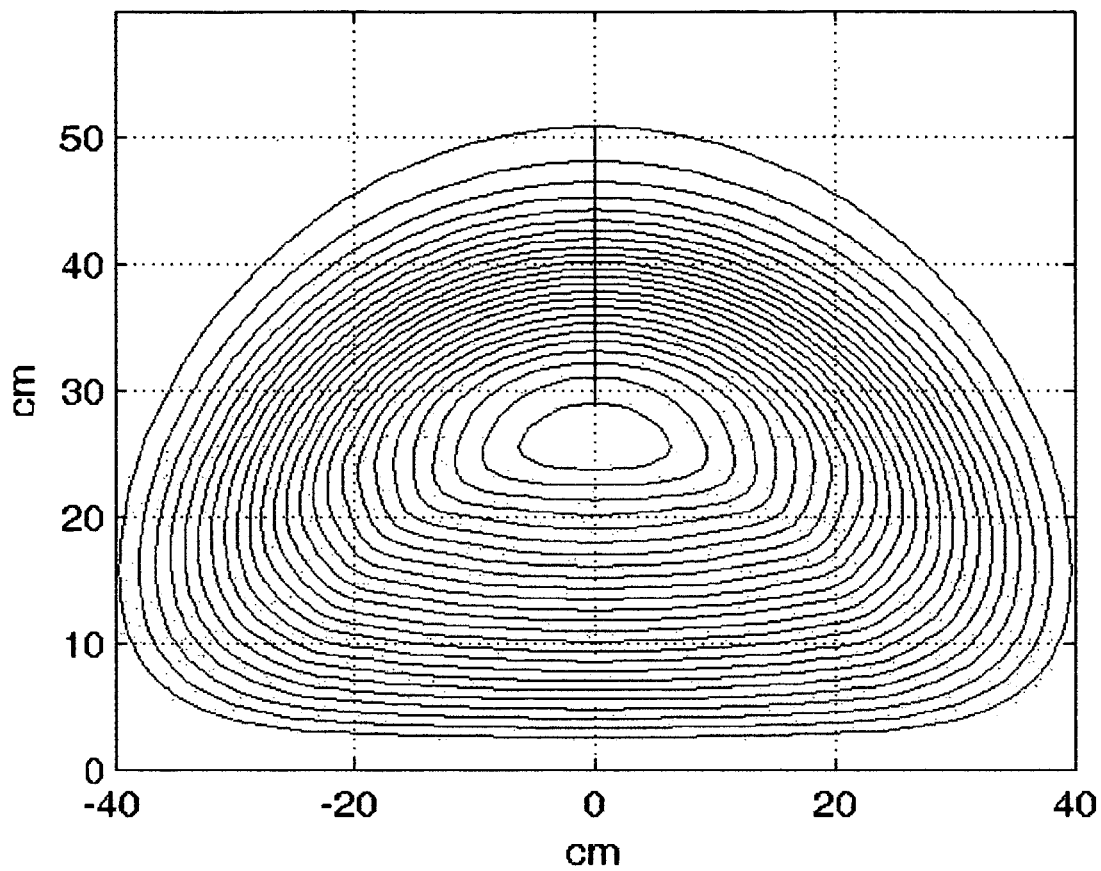
FIG. 3d shows one half of an X or Y shield transverse coil pattern with a circular footprint.

Furthermore, to limit the radial extent in such a tight design with very high current densities the last few turns of the axial gradients in both the primaries and the shields are reversed so they produce an opposite field to cancel the field spill-out and provide gradient confinement within the magnet pole space as can be seen in FIG. 3a. The result is lower energy and lower overall inductance while achieving very high switching speeds, i.e. about 50 to 150% gain using the same amplifier setting. This is a novel approach in axial gradient designs and construction.

The shielded transverse gradients are designed by starting with the field, inductance and energy expressed in polar coordinates to maintain a circular geometry and then incorporating a constrained minimization to keep the energy, and hence the inductance, as small as possible but where the constraint points and values where optimized by the Nelder-Mead optimization algorithm in which the cost function includes the gradient efficiency, linearity and inductance. This yields an optimal design for a chosen radial and vertical configuration. Using this approach, the vertical separations between primary and shield are fixed and the constraint values are chosen so the radial extents are also fixed. Thus, for a fixed set of physical values, the designs yield the optimal performance for the shielded transverse gradients.

A further enhancement of the design comes from the fact that a cylindrical bi-planar configuration is a more natural geometry for axial shielded gradients, but an inefficient one for transverse-shielded gradients. This dichotomy is resolved by placing both the axial primary and shield coils inside the transverse primary and shield coils. This entails putting both the transverse primaries and shields on the outside of the axial primaries and shields to provide an overall better three-axis shielded gradient performance. Shields in general deteriorate the efficiency of the primary gradients; thus the further away they are the better.

Using these approaches, a typical gradient coil prepared in accordance with the present invention has yielded axial and transverse shielded performances with peak gradients approaching 0.15 mT/m/A, inductances well below 800 uH, linearity of less than +/−5% on a 30 cm DSV, and shielded performances that suppress both odd and even eddy field production to less than 1-0.1% of peak gradients in a physical space that contains the gradients within a 45 mm vertical height, 90 cm diameter and gradient upper to lower axial separation of 50 cm. Those skilled in the art of gradient coil design and production will recognize the optimal performance achieved in a very compact physical space, yet very wide upper to lower gradient gap.

The use of the target field method of the present invention allows the design of shims of any order since the technique is an analytical one. Therefore, designs for 0th, 1st, 2nd order as well as 3rd, 4th, 5th, and even higher Legendre polynomial shim coils are easily generated and incorporated in the gradient coils. To avoid coupling the 1st order shims to the gradients because they are also linear or 1st order, these shims are placed above the axial and transverse shield coil layers and all other order shims are placed in the space between the primary and shield axial and transverse coils. This saves space and optimizes the geometric compactness of the entire assembly.

The present design contrasts with previous approaches that have been based on rectangular coordinates and use a Gaussian or similar tapering function to limit the planar extent of the primary coil. That approach suffers for two fundamental reasons. First, the geometric footprint is not circular and consequently not optimal. Second, it does not allow for solving the shield layer self-consistently to obtain a shield coil similarly limited in planar extent.

A further advantage of the present invention is that it allows specifying the most linear gradient field production possible while achieving the ultra-fast switching (by including energy minimizing constraints) and minimal eddy current production due to shielding the primary gradient coil layer. The shielding, minimum energy constraints and radial limits combine to limit the field spill-out, which consequently result in ultra-fast switching. While the rate of switching normally depends upon the amplifier used with the MRI system, the lower the inductance and resistance, the faster gradients can be switched. Thus the present invention is capable of producing inductances of 800 μH or less with resistances well under 250 mΩ depending on the type and size of the coil material used.

Added to the benefits derived from the invention is that it permits a manufacturing process which provides for the most efficient physical stacking of gradient, shim and cooling layers.

Figure 4:
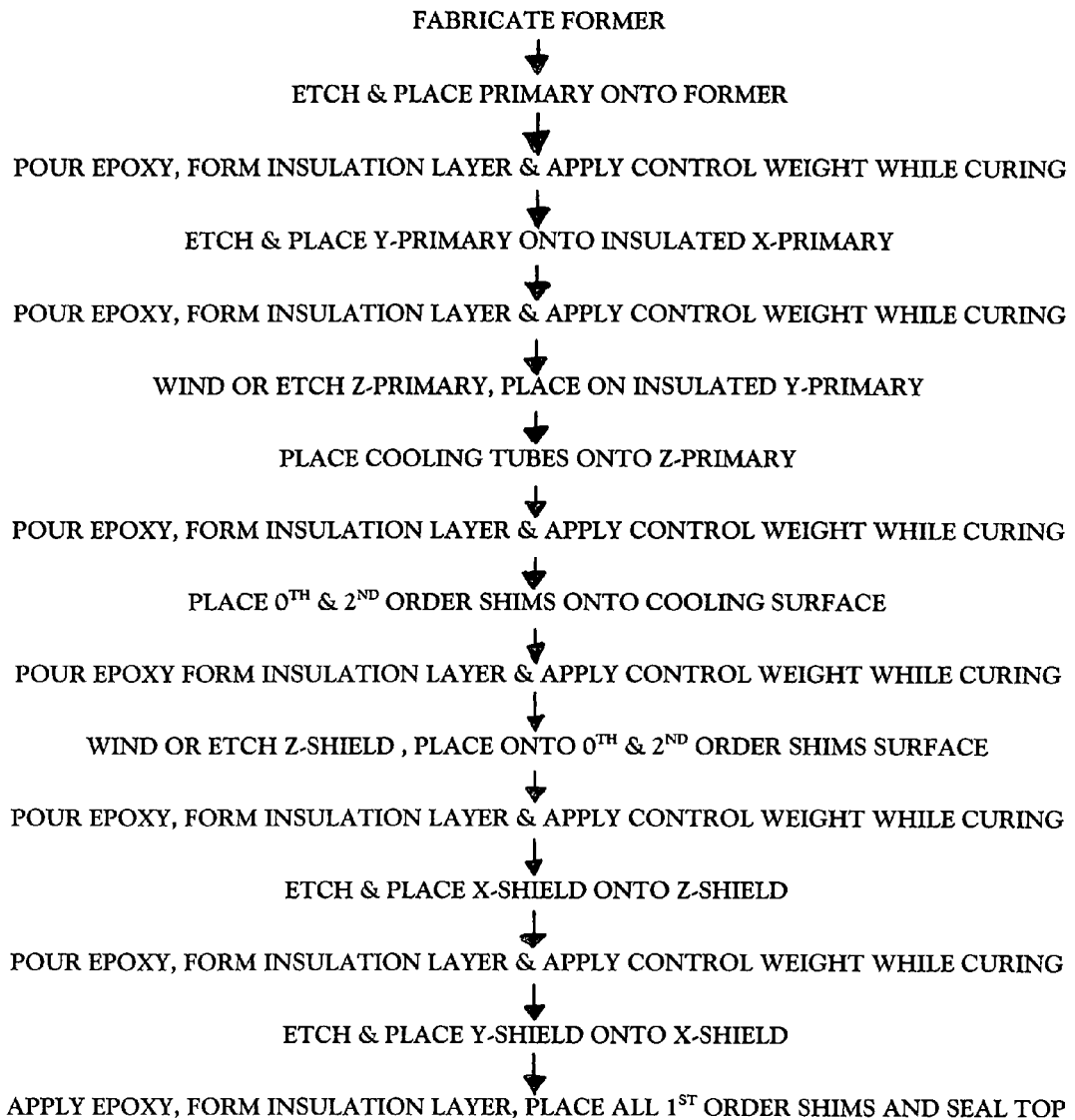
FIG. 4 is a block diagram showing the key steps in the manufacturing process of this invention.
Figure 5:
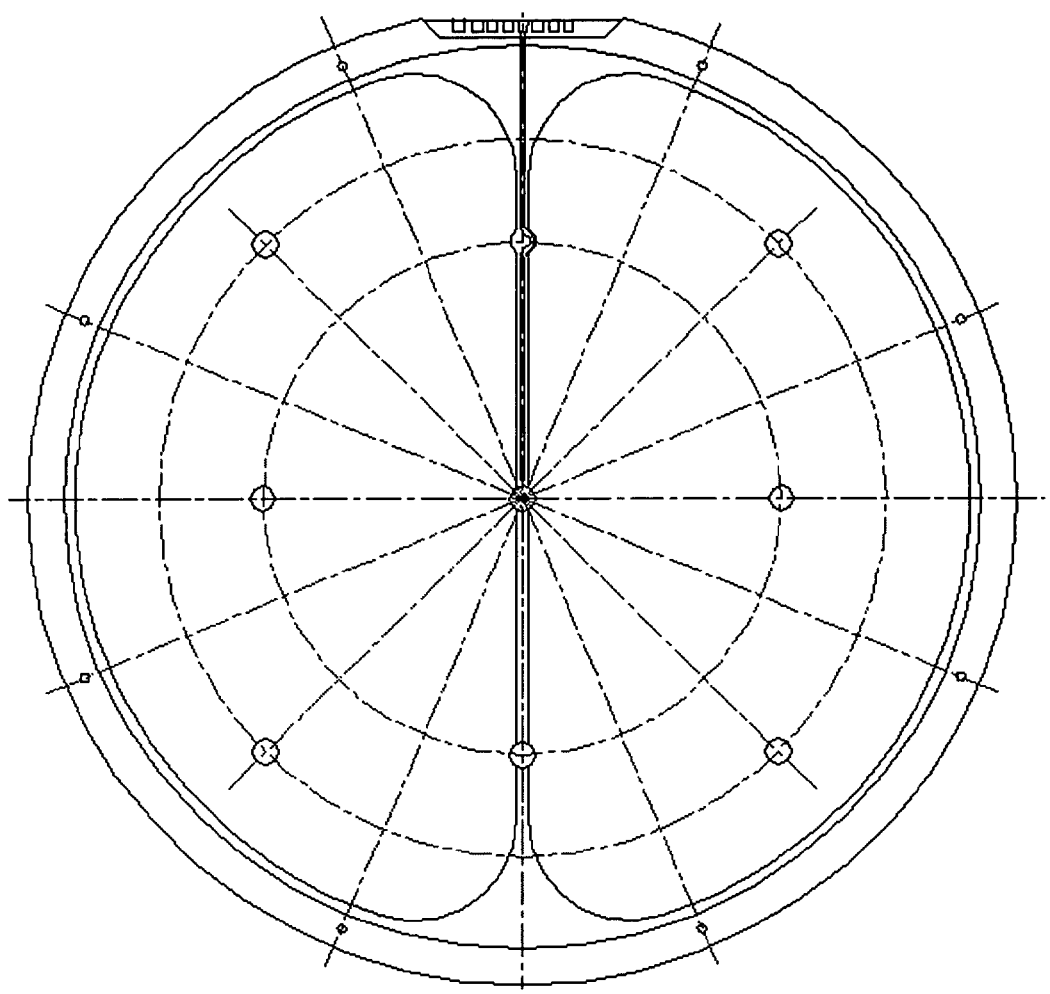
FIG. 5 is a top view of a cylindrical former which holds the multiple layers of a gradient coil, serves as a means to attach the gradient coil to the magnet pole, and has recesses in transverse patterns for running busbars to connect the gradient coil patterns while avoiding build-up of vertical size.

The manufacturing process begins by the specific choice of former to contain and enclose the various layers. FIG. 4 provides a summary of the manufacturing process and FIG. 5 shows a former as produced below. The former is part of the gradient coil assembly. It is what holds everything together and mounts to the magnet pole faces. There are mounting holes on the outer edges of the former in addition to the alignment pinholes, which also serve as mounting holes when the entire gradient assembly has been constructed. A fiber cloth braid/weave mesh pattern or other similar insulative material forms the starting base for the former. An iron form of the appropriate dimension is used to mold the former including the mounting and screw holes. Each fiber cloth is laid inside the mold and is potted by epoxy. When the last layer is reached a pressure mold is used to obtain a flat control surface. Furthermore, the iron mold is tapered at an angle of about 3 degrees to release the former when the epoxy has set and the pressure mold is completed. The former wall thickness generally ranges from about 1 mm to about 5 mm, preferably about 1-2 mm. The former height generally ranges from 30 mm-45 mm. The choice of mesh and epoxy forms a strong and rigid base to hold the weight of the various gradient coil layers and also dampen acoustic noise generation. Using a fiber cloth weave design and potting with an epoxy combines the benefits of being strong yet thin and hence takes up the least amount of space.

As best seen in FIG. 5, alignment holes are preferably strategically placed throughout the former during the molding process so that the gradient coils that have matching holes throughout can be aligned with the former and to each other during the construction process. The holes are placed through-out the gradient stack such that they can be used as mounting supports to the magnet pole face to help suppress acoustic noise generation. The alignment holes alter the original path of the currents and in a shielded design, where the balance is very delicate, the placement of the holes is designed to have minimal impact yet suppress acoustic noise generation as best as possible. Thus the holes are located away from the densest regions in the coil patterns. For example, in the axial gradient pattern of FIG. 3a there is a lot of space where the reverse currents are and placing the holes in these locations is ideal because it requires minimal rearrangement of the wires/tracks.

An important space management technique used to obtain the most compact stacking possible is by etching the gradient coils from a thin copper plate typically between 3-5 mm thickness with a circular footprint. A high-pressure water-jet cutting machine is used to etch the wire tracks in the plate. Etching the wire patterns gives a lot of freedom in achieving the many optimal performance targets because the wire tracks can have variable widths that are often needed due to tight design requirement. The etching process is so precise that it allows etching of the alignment and support holes in the gradient coil plates as well.

Once the plates are etched by the above process, they become loose and wire track positions can change because the whole plate structure is no longer rigid. Two methods have been developed to overcome this problem. In the first method, tabs are left strategically throughout the etching process so that etched curfs are not completely cutout but rather help keep the plate structure rigid. Once the plate is removed from the water-jet machine, the empty curfs are filled with epoxy and allowed to cure so that the rigidity of the plate is now maintained by the epoxy fill. Subsequently, the tabs are removed so adjacent wire tracks are not shorted to each other. In this way, the wire track positions are kept intact.

Alternatively, curf paths are molded into place using an insulative material that has a thin flat base on top of which lies the curf tracks. This track is then laid inside the former and the flat portion serves as an insulative layer between two coil layers while the tracks serve to align the etched plates into their designed physical positions. In this scheme, the plate structure is etched continuously without leaving tabs in the curfs. Although, the plate is not rigid when the etching is initially finished, the positions are restored to their designed value when placed on the alignment insulative mold as described above.

For the axial gradients, care should be taken to avoid leaving big areas of copper especially in the middle. Either these pieces are cut out or slits are etched in wide areas of copper patches to prevent the induction of eddy currents from other gradients. To prevent a high resistance in the axial gradients, a thicker copper plate is preferably used for the primary gradient while a thinner copper plate is preferably used for the shield. For example, a 5 mm plate can be used for the primary and a 3 mm plate for the shields. By this approach a reduction of resistance is gained compared to using thin copper plates in the primary axial gradients as well. This reduction in resistance is very significant because it means less heat is generated and less power is needed to drive the coils. Thus the gradients produced by the present invention are stronger and switch faster.

After the first gradient coil layer is put in place, a thin (typically 0.5 mm) insulator layer is formed by a fiber cloth substrate and potted with epoxy after allowing it to settle. Then the next layer of the gradient coil can be placed atop the insulator layer. Subsequently, after another insulator layer, the third gradient coil is placed atop the previous two. The gradient coil layers are potted by pouring epoxy between the wire track etchings that are about 0.8 mm wide. To maintain a tight tolerance, generally about 0.1 mm variation across any surface, the plates are stacked in the former placed on a flat control surface with a tolerance of less than 0.1 mm, and a flat, heavy weight of the same tolerance and control surface is applied during the epoxy curing process.

Because the gradient return loops need to run to the center of each gradient coil these return tracks are created in between each semicircle for the X- and Y-gradient coils by exploiting their orthogonality. For the Z-gradient coil, the return track is either etched in the former if it is the first layer or placed facing away from the gradients if it is on top. The only separations between gradient coil layers are the insulation layers. This is a key step in the stacking efficiency. For such a thin separation, the limit before exceeding the onset of corona effects is 50 kV/in voltage gradients. Thus, the insulation thickness has to be consistent with the amplifier drive voltages used. The voltages can vary anywhere from 100 to 500 or more volts so long as the voltage divided by the separation between gradient layers is below 50 kV/in.

The layers are placed in the former and relative to each other using alignment pins during the placement of each layer. The alignment pins differ in height and continue to grow as the layers are built up. The flat weights have the corresponding holes to accommodate the alignment holes during the curing process.

It is a fact that if the shield layers are placed directly on top of the primary layers, then the fields produced in the imaging volume will be nulled out. Consequently, the shield layers must be placed at some distance away from the primary layers, preferably as far apart as possible. Distancing the shield layers from the primaries is made easier by using etched plate technology with its high density stacking of wire tracks because of the ease in providing variable wire track widths and thus a better approximation of the theoretical design.

To obtain the most optimal stacking as called for by the performance specification, all of the shim and cooling layers are placed in between the primary layers and the shield layers with the exception of the $1^{st}$ order shims because they will couple to the gradients. The $1^{st}$ order shims are placed on top of the shield layers. To make the shims as compact as possible, they are designed by the same method using polar coordinates and a radial envelope function to limit their planar extent. In addition, improved stacking efficiency can be obtained by etching each shim from a 0.1 to 0.5 mm thick insulated copper plate. Preferably the shims have the same alignment holes as the other layers within the gradient coil. The shims are pre-processed to be self-insulated. The shims can then be stacked atop each other and potted by an epoxy pour running through the etched tracks and a controlled surface weight applied during the curing process. The surface weight is used for compression and to maintain the flatness of the system, preferably to within about 0.06 mm across the entire surface. If too much weight is used, the epoxy will be pushed out. If too little weight is used, then the layer buildup will be greater and the imaging region reduced beyond what was intended. Therefore, the weight of the compression plates is used to control the surface build up.

Figure 6A:
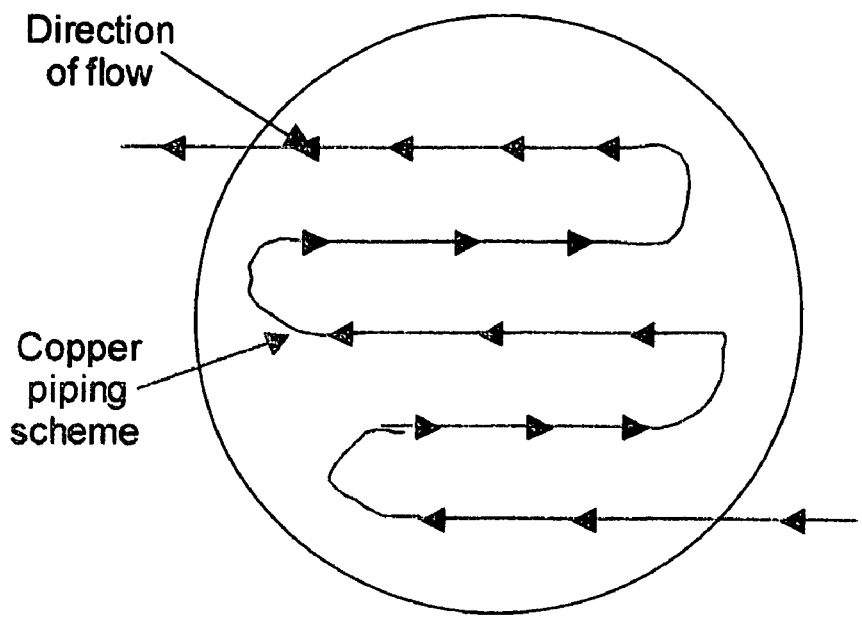
FIGS. 6a and 6b show two alternative cooling tube designs for use with the cylindrical gradient coil of this invention.
Figure 6B:
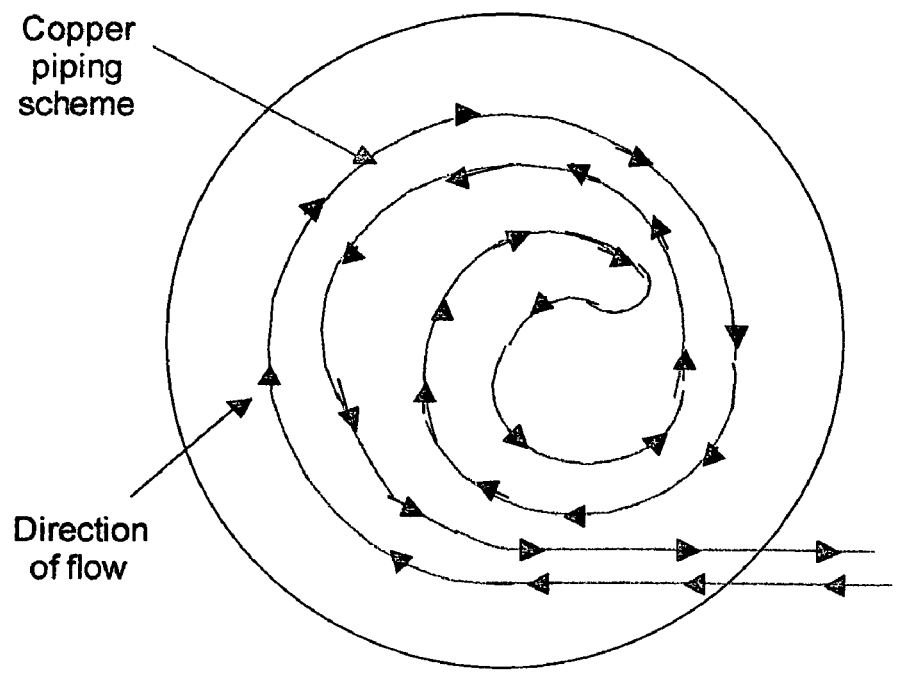

Cooling can be added to the gradient coils by any of several means. One approach is to use channels in the layer between the primaries and the shields and then use air to cool the gradients. This method relies on convective heat current elimination. A more efficient method is to use copper tubes with chilled water running through and using conductive cooling. The chilled water approach, however, generates eddy currents in the copper tubes and requires the physical size of the tubes to be quite large. To avoid generating eddy currents, a zig-zag pattern or similar patterns such as those shown in FIGS. 6a and 6b can be used. FIG. 6b represents a preferred pattern. To pack as much copper tubing between the primary and shield layers as possible, the bending radius of the copper tubes, $r >= 5 \times dia$, can be exploited. A 3/16" diameter copper tube is sufficient for this purpose.

The cooling scheme of FIG. 6b is preferred for a more even distribution of cold flow to hot flow between the incoming to outgoing flow. Furthermore, these tubes can be made of plastic as well and any pattern can be wound because they are not conductive and eddy currents will not be induced. Moreover, instead of fluid, air cooling can also be used to remove heat although it won't be as effective as using fluid. Yet even further, instead of tubes just channels can be formed in the cooling space and used for either fluid or air-cooling purposes without worrying about inducing eddy currents.

The entire gradient coil layer, which contains the shims and cooling, is potted together to form a very rigid unit. It has enough weight to withstand severe deformations or vibrations. Consequently, the potting procedure has the added advantage of suppressing acoustic noise generation resulting when the gradients are pulsed against the high static background field.

Wire interconnects are strategically placed between the various quadrants, top and bottom layers to give an extra degree of freedom in shunting current away from any quadrant for the delicate shielding balance required. This balance can be thrown off by manufacturing imperfections due to translational, rotational or vertical misplacement or offsets of the many gradient coil layers throughout. If this passive correction doesn't work, a final active correction can be applied because of the symmetry of the gradients and shims. Pulses can be applied to the shims when the gradients are turned on to provide a final, almost perfect correction which will cancel any eddies and make the shielded gradient coils work almost perfectly.

What is claimed is:

1. A bi-planar gradient coil assembly, said gradient coil assembly comprising:
   a cylindrical former with one end capped forming a planar surface;
   a planar, disk-shaped primary coil set placed flat against the planar support surface inside of said cylindrical former;
   a planar, cooling layer placed coplanar and atop said planar primary coil;
   a planar, first shim coil set placed coplanar and atop said planar cooling layer;
   a planar, support member placed atop said planar first shim coil set;
   a planar, disk-shaped shielding coil set for said planar primary coil set placed coplanar and atop said planar support members inside said cylindrical former; and
   a planar, second shim coil set placed coplanar and atop said planar shield coil set inside said cylindrical former.

2. The gradient coil assembly of claim 1 wherein said cooling layer comprises one or more conduits containing coolants for transporting heat generated during operational use away from said gradient coil assembly.

3. The gradient coil assembly of claim 1 wherein said first shim coil set comprises a Z0, Z2, ZX, ZY, X2, Y2, XY, Z4 and higher order planar shim coils for the purposes of correcting to terms in the spherical harmonic expansion of the main magnetic field.

4. The gradient coil assembly of claim 1, wherein:
   said support member is made of an insulative material and a curable adhesive mechanically coupling the previous layers with said shielding and subsequent planar layers to form a single unit in each cylindrical support member; and
   said support member being sufficiently stiff to substantially cancel torques generated by the primary and shield coil sets thereby reducing the acoustic noise generated during operation of said gradient coil assembly.

5. The gradient coil assembly of claim 1, wherein two bi-planar gradient coil assemblies are placed inside an annular pole face region of a main magnet of a magnetic resonance imaging apparatus with the gradient coil assembly planar support ends facing towards an imaging region of the magnetic resonance imaging apparatus and disposed symmetrically to each other about a plane of symmetry parallel to each and the pole faces.

6. The gradient coil assembly of claim 1, wherein:
   said second shim coil set comprises a X, Y, Z, Z3 and higher order planar shim coils for the purposes of generating linear or higher order magnetic fields that correct inhomogeneities in the main magnetic field;
   said second shim coils are so placed above the shield layers to avoid coupling to the linear magnetic filed gradient coils; and
   the linear shim coils correct leakage shield fields generated by imperfections in the gradient coil manufacturing process, wherein said linear magnetic field generating shim coils can be driven by pulsed currents during the operation of the gradient coils.

7. The gradient coil assembly of claim 5, wherein:
   said primary coil set comprises planar X, Y, and Z-primary coils; and
   each said primary coil is driven by a pulsed current signal to selectively generate a first spatially varying magnetic field in said imaging region.

8. The gradient coil assembly of claim 7, wherein:
   said shielding coil set comprises planar X, Y, and Z-shield coils;
   each shield coil is driven by a pulsed current signal substantially 180° out-of-phase with respect to said first pulsed current to selectively generate a second spatially varying magnetic field substantially opposed to said first spatially varying magnetic filed in the imaging region, and substantially cancel said magnetic fields on the outer surfaces of the shield coil layers adjacent to the pole faces and opposite said imaging region.

* * * * *